US012566214B2

(12) United States Patent
Lim

(10) Patent No.: US 12,566,214 B2
(45) Date of Patent: Mar. 3, 2026

(54) BATTERY ABNORMALITY DIAGNOSIS APPARATUS AND METHOD

(71) Applicant: LG ENERGY SOLUTION, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 559 days.

(21) Appl. No.: 18/014,297

(22) PCT Filed: Aug. 9, 2021

(86) PCT No.: PCT/KR2021/010470
§ 371 (c)(1),
(2) Date: Jan. 3, 2023

(87) PCT Pub. No.: WO2022/035149
PCT Pub. Date: Feb. 17, 2022

(65) Prior Publication Data
US 2023/0258725 A1     Aug. 17, 2023

(30) Foreign Application Priority Data

Aug. 10, 2020     (KR) ........................ 10-2020-0100131

(51) Int. Cl.
| *G01R 31/36* | (2020.01) |
| *G01R 31/367* | (2019.01) |
| *G01R 31/3842* | (2019.01) |
| *G01R 31/396* | (2019.01) |
| *G08B 21/18* | (2006.01) |

(52) U.S. Cl.
CPC ....... *G01R 31/3648* (2013.01); *G01R 31/367* (2019.01); *G08B 21/185* (2013.01); *G01R 31/3842* (2019.01); *G01R 31/396* (2019.01)

(58) Field of Classification Search
CPC .............. G01R 31/3648; G01R 31/367; G01R 31/3842; G01R 31/396; G08B 21/185
See application file for complete search history.

(56) References Cited

U.S. PATENT DOCUMENTS

| 5,703,469 A | 12/1997 | Kinoshita |
| 2004/0001996 A1 | 1/2004 | Sugimoto |
| 2006/0066285 A1 | 3/2006 | Minamiura |
| 2012/0004873 A1* | 1/2012 | Li ........................... G01R 31/36 |
| | | 320/134 |

(Continued)

FOREIGN PATENT DOCUMENTS

| CN | 103513184 A | 1/2014 |
| CN | 110346726 A | 10/2019 |

(Continued)

OTHER PUBLICATIONS

International Search Report (PCT/ISA/210) issued in PCT/KR2021/010470 mailed on Nov. 25, 2021.

*Primary Examiner* — John C Kuan
(74) *Attorney, Agent, or Firm* — Birch, Stewart, Kolasch & Birch, LLP

(57) ABSTRACT

A battery abnormality diagnosis apparatus including a voltage obtaining unit obtaining a voltage of a battery cell, an analyzing unit calculating estimation information for estimating the voltage of the battery by analyzing the voltage of the battery cell, and a diagnosing unit diagnosing abnormality of the battery cell by analyzing the estimation information.

16 Claims, 8 Drawing Sheets

(56)                References Cited

U.S. PATENT DOCUMENTS

| | | | |
|---|---|---|---|
| 2013/0234672 A1 | 9/2013 | Kubota et al. | |
| 2013/0342212 A1 | 12/2013 | Kawahira et al. | |
| 2017/0259687 A1* | 9/2017 | Chikkannanavar | ..................... H02J 7/00308 |
| 2019/0077265 A1* | 3/2019 | Ono | .................... H01M 10/482 |
| 2019/0113577 A1 | 4/2019 | Severson et al. | |
| 2019/0137573 A1* | 5/2019 | Hatano | ............. H02J 7/007184 |
| 2020/0185789 A1 | 6/2020 | Kanada et al. | |
| 2020/0355749 A1 | 11/2020 | Takahashi et al. | |
| 2021/0278469 A1* | 9/2021 | Davis | ................... G01R 31/385 |
| 2023/0086915 A1* | 3/2023 | Tian | ...................... G01R 31/52 |
| | | | 324/432 |
| 2023/0184838 A1 | 6/2023 | Lim | |
| 2023/0266393 A1 | 8/2023 | Lim | |

FOREIGN PATENT DOCUMENTS

| | | | |
|---|---|---|---|
| EP | 4 137 829 A1 | 2/2023 | |
| EP | 4 152 023 A1 | 3/2023 | |
| JP | 8-336202 A | 12/1996 | |
| JP | 2002-252901 A | 9/2002 | |
| JP | 2004-31120 A | 1/2004 | |
| JP | 2006-98135 A | 4/2006 | |
| JP | 2006-126172 A | 5/2006 | |
| JP | 2008-256436 A | 10/2008 | |
| JP | 4186811-82 | 11/2008 | |
| JP | 2009-250796 A | 10/2009 | |
| JP | 2014-72992 A | 4/2014 | |
| JP | 5786324 B2 | 9/2015 | |
| JP | 5994240 B2 | 9/2016 | |
| JP | 6532373 B2 | 6/2019 | |
| JP | 6532374 B2 | 6/2019 | |
| JP | 6589222 B2 | 10/2019 | |
| JP | 2020-92047 A | 6/2020 | |
| JP | WO2019/138286 A1 | 2/2021 | |
| KR | 10-1465380 B1 | 11/2014 | |
| KR | 10-1642329 B1 | 7/2016 | |
| KR | 10-2018-0066606 A | 6/2018 | |
| KR | 10-1930647 B1 | 3/2019 | |

* cited by examiner

BATTERY ABNORMALITY DIAGNOSIS APPARATUS AND METHOD

TECHNICAL FIELD

Cross-Reference to Related Application

This application claims priority to and the benefit of Korean Patent Application No. 10-2020-0100131 filed in the Korean Intellectual Property Office on Aug. 10, 2020, the entire contents of which are incorporated herein by reference.

Technical Field

The present invention relates to a battery abnormality diagnosis apparatus and method for diagnosing abnormality of a battery in an idle period.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium ion batteries. Among the secondary batteries, a lithium ion battery has a much higher energy density than those of the conventional Ni/Cd batteries, Ni/MH batteries, etc. Moreover, the lithium ion battery may be manufactured to be small and lightweight, such that the lithium ion battery has been used as a power source of mobile devices. In addition, the lithium ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation.

Meanwhile, generally, a secondary battery of an energy storage system (ESS) includes diagnosis lists for making a diagnosis before fire occurs. Such a diagnosis list includes several values regarding voltage, current, temperature, power, etc., for preventing the fire, and the secondary battery performs a diagnosis mainly for an over-voltage or an under-voltage.

However, in the secondary battery, abnormality may substantially occur in a range other than a top or a base of a voltage. For example, fire may occur even when a warning notification for the over-voltage or the under-voltage is not generated. Thus, a new diagnosis item is required to solve the problems of fire as well as the over-voltage or the under-voltage.

DISCLOSURE

Technical Problem

The present invention has been designed to solve the foregoing problems and aims to provide a battery abnormality diagnosis apparatus and method by which an abnormality type in an idle period of a battery may be classified by diagnosing an unstable behavior of a voltage in the idle period of the battery through regression analysis.

Technical Solution

A battery abnormality diagnosis apparatus according to an embodiment disclosed in this document includes a voltage obtaining unit obtaining a voltage of a battery cell, an analyzing unit calculating estimation information for estimating the voltage of the battery by analyzing the voltage of the battery cell, and a diagnosing unit diagnosing an abnormality of the battery cell by analyzing the estimation information.

In an embodiment, the estimation information may include a voltage estimation equation related to the voltage of the battery cell, and the diagnosing unit may diagnose the abnormality of the battery cell based on a slope difference with respect to time in the voltage estimation equation.

In an embodiment, the diagnosing unit may diagnose the battery cell as idle long-time relaxation abnormality when the slope difference is less than a first reference value, and diagnose the battery cell as post-charging or post-discharging idle voltage abnormality when the slope difference is greater than or equal to the first reference value.

In an embodiment, the first reference value may be determined based on a standard deviation for the slope difference of the voltage estimation equation for a plurality of battery cells included in a battery rack.

In an embodiment, the diagnosing unit may diagnose the battery cell as post-charging idle voltage abnormality when a start voltage of an idle period of the battery cell is greater than a second reference value and diagnose the battery cell as post-discharging idle voltage abnormality when the start voltage of the idle period of the battery cell is less than or equal to the second reference value, in case of the slope difference being greater than or equal to the first reference value.

In an embodiment, the second reference value may be determined as a voltage corresponding to a SOC of the battery cell being 50%.

In an embodiment, the diagnosing unit may diagnose the battery cell as post-charging idle voltage abnormality when current of the battery cell flows in a first direction and diagnose the battery cell as post-discharging idle voltage abnormality when the current of the battery cell flows in a second direction that is opposite to the first direction, in case of the slope difference being greater than or equal to the first reference value.

In an embodiment, the analyzing unit may calculate the voltage estimation equation in the idle period after charging or discharging of the battery cell.

In an embodiment, the battery abnormality diagnosis apparatus may further include a notifying unit generating an alarming notification when the diagnosing unit determines that abnormality occurs in the battery cell.

A battery abnormality diagnosis method according to an embodiment disclosed in this document includes obtaining a voltage of a battery cell, calculating estimation information for estimating the voltage of the battery by analyzing the voltage of the battery cell, and diagnosing abnormality of the battery cell by analyzing the estimation information.

In an embodiment, the estimation information may include a voltage estimation equation related to the voltage of the battery cell, and the diagnosing of the abnormality of the battery cell may include diagnosing the abnormality of the battery cell based on a slope difference with respect to time in the voltage estimation equation.

In an embodiment, the diagnosing of the abnormality of the battery cell may include diagnosing the battery cell as idle long-time relaxation abnormality when the slope difference is less than a first reference value, and diagnosing the battery cell as post-charging or post-discharging idle voltage abnormality when the slope difference is greater than or equal to the first reference value.

In an embodiment, the diagnosing of the abnormality of the battery cell may include diagnosing the battery cell as post-charging idle voltage abnormality when a start voltage of an idle period of the battery cell is greater than a second reference value and diagnosing the battery cell as post-discharging idle voltage abnormality when the start voltage of the idle period of the battery cell is less than or equal to the second reference value, in case of the slope difference being greater than or equal to the first reference value.

In an embodiment, the diagnosing of the abnormality of the battery cell may include diagnosing the battery cell as post-charging idle voltage abnormality when current of the battery cell flows in a first direction and diagnosing the battery cell as post-discharging idle voltage abnormality when the current of the battery cell flows in a second direction that is opposite to the first direction, in case of the slope difference being greater than or equal to the first reference value.

Advantageous Effects

According to the battery abnormality diagnosis apparatus and method of the present invention, by diagnosing an unstable behavior of a voltage in an idle period of a battery through regression analysis, an abnormality type in the idle period of the battery may be classified.

MODE FOR INVENTION

Figure 1:
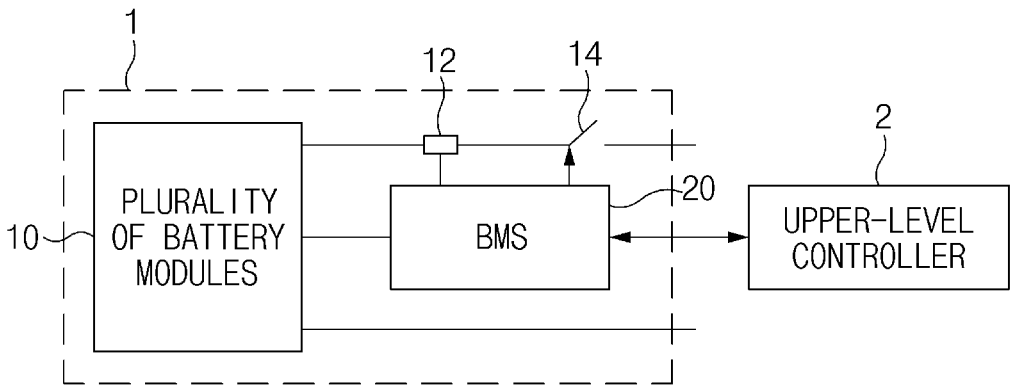
FIG. 1 is a block diagram of a general battery rack.

Hereinafter, various embodiments of the present invention will be described in detail with reference to the accompanying drawings. In this document, identical reference numerals will be used for identical components in the drawings, and the identical components will not be redundantly described.

For various embodiments of the present invention disclosed in this document, specific structural or functional descriptions are only exemplified for the purpose of describing the embodiments of the present invention, and various embodiments of the present invention may be implemented in various forms, and should not be construed as being limited to the embodiments described in this document.

As used in various embodiments, the terms "$1^{st}$", "$2^{nd}$", "first", "second", or the like may modify various components regardless of importance, and do not limit the components. For example, a first component may be named as a second component without departing from the right scope of the present disclosure, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All of the terms used herein including technical or scientific terms have the same meanings as those generally understood by an ordinary skilled person in the related art. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

FIG. 1 is a block diagram of a general battery rack.

Referring to FIG. 1, a battery control system including a battery rack 1 and a upper-level controller 2 included in a upper-level system according to an embodiment of the present invention is schematically shown.

As shown in FIG. 1, the battery rack 1 may include a battery module 10 that includes one or more battery cells and is chargeable/dischargeable, a switching unit 14 serially connected to a positive (+) terminal side or a negative (−) terminal side of the battery module 10 to control a charging/discharging current flow of the battery module 10, and a battery management system (e.g., RBMS) 20 for control and management to prevent over-charging and over-discharging by monitoring voltage, current, temperature, etc., of the battery rack 1. The battery rack 1 may include a plurality of battery modules 10, sensors 12, switching units 14, and battery management systems 20.

Herein, as the switching unit 14 which is an element for controlling a current flow for charging or discharging of the plurality of battery modules 10, for example, at least one relay, magnetic contactor, etc., may be used according to specifications of the battery rack 1.

The battery management system 20, which is an interface for receiving measurement values of the above-described various parameters, may include a plurality of terminals and a circuit, etc., connected thereto to process input values. The battery management system 20 may control on/off of the switching unit 14, e.g., a relay, a contactor, etc., and may be connected to the battery module 10 to monitor a state of each battery module 10.

Meanwhile, the battery management system 20 according to the present invention may perform regression analysis on a voltage of a battery cell through a separate program, as will be described below. An abnormal type of the battery cell may be classified using a calculated regression equation.

The upper-level controller 2 may transmit a control signal regarding the battery module 10 to the battery management system 20. Thus, the battery management system 20 may also be controlled in terms of an operation thereof based on a signal applied from the upper-level controller 2. Meanwhile, the battery cell according to the present invention may be included in the battery module 10 used for an energy storage system (ESS). In this case, the upper-level controller 2 may be a controller (BBMS or battery bank management system) of a battery bank including a plurality of racks or an ESS controller for controlling the entire ESS including a plurality of banks. However, the battery rack 1 is not limited to such a purpose.

Such configurations of the battery rack 1 and the battery management system 20 are well-known configurations, and thus will not be described in detail.

Figure 2:
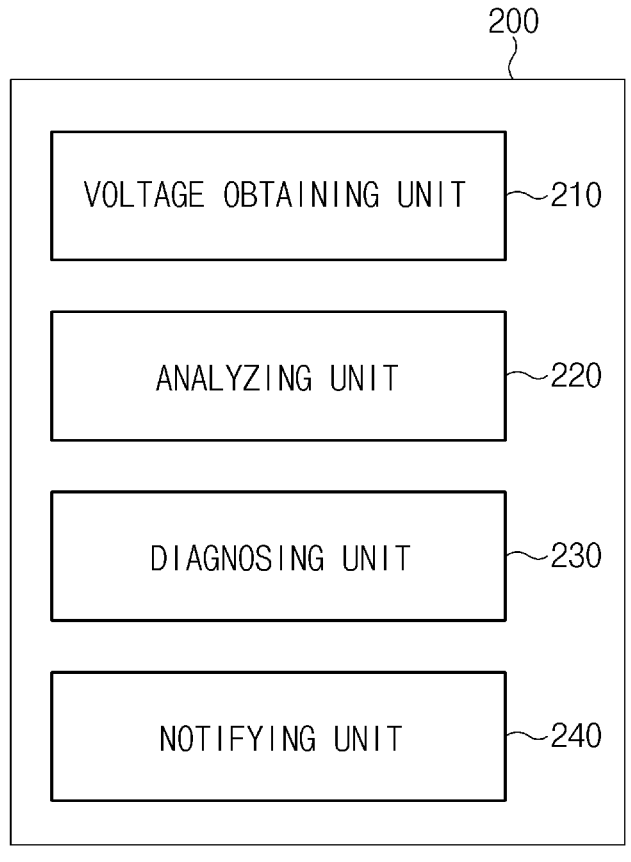
FIG. 2 is a block diagram showing a structure of a battery abnormality diagnosis apparatus according to an embodiment of the present invention.

FIG. 2 is a block diagram showing a structure of a battery abnormality diagnosis apparatus according to an embodiment of the present invention.

A battery abnormality diagnosis apparatus 200 of FIG. 2 may be included in a BMS (battery management system) that manages the battery module 10, a BMS that manages the battery rack 1, or a system controller that manages the entire ESS, and may diagnose abnormality by collecting voltage data of each battery module from a plurality of rack BMSs included in a plurality of banks. For example, the battery abnormality diagnosis apparatus 200 of FIG. 2 may be included in the battery management system 20 or the upper-level controller 2 of FIG. 1 described above.

Classification, performed by the battery abnormality diagnosis apparatus 200 according to an embodiment of the present invention, of the abnormality type of the battery cell may be a process after it is determined that abnormality occurs in the battery cell through an abnormality detection algorithm (e.g., main component analysis, etc.) of the battery cell. That is, the following description will be made of the battery abnormality diagnosis apparatus 200 according to the present invention on the assumption that occurrence of an abnormal behavior in the battery cell has been already detected through a series of processes. However, this is merely an example, and the present invention is not limited thereto, and the battery abnormality diagnosis apparatus 200 according to the present invention may class the abnormality type by analyzing data in real time regardless of determination of whether the abnormal behavior is detected.

Referring to FIG. 2, the battery abnormality diagnosis apparatus 200 according to an embodiment of the present invention may include a voltage obtaining unit 210, an analyzing unit 220, a diagnosing unit 230, and a notifying unit 240.

The voltage obtaining unit 210 may obtain a voltage of the battery cell. For example, the voltage obtaining unit 210 may measure the voltage of the battery cell at specific time intervals. According to an embodiment, the voltage obtaining unit 210 may receive the measured voltage of the battery cell from another device. In addition, the voltage obtaining unit 210 may measure current flowing in the battery cell.

The analyzing unit 220 may calculate estimation information related to the voltage of the battery cell by analyzing the obtained voltage of the battery cell. According to an embodiment, the estimation information may include a voltage estimation equation related to the voltage of the battery cell. According to an embodiment, the analyzing unit 220 may calculate the voltage estimation equation of the battery cell by performing regression analysis on the obtained voltage of the battery cell. In this case, the analyzing unit 220 may calculate the voltage estimation equation for the idle period after charging or discharging of the battery cell. The analyzing unit 220 may calculate the voltage estimation equation regarding the voltage of the battery cell with respect to a set window size (e.g., 30 minutes). For example, the analyzing unit 220 may calculate the voltage estimation equation as below.

$$y = aX_{Ts-Te} + b \qquad \text{Equation (1)},$$

(where Ts indicates a start time of an idle period, Te indicates an end time of the idle period, and X indicates a voltage of a battery cell.)

The diagnosing unit 230 may diagnose abnormality of the battery cell by analyzing the voltage estimation equation calculated by the analyzing unit 220. For example, the diagnosing unit 230 may calculate a slope a of the voltage estimation equation and a slope difference $(a_{t+1} - a_t)$, and use them to diagnose abnormality of the battery cell. A time interval regarding the slope difference may be a sampling time (e.g., 1 second).

More specifically, the diagnosing unit 230 may diagnose the battery cell as idle long-time relaxation abnormality, when a standard deviation for the slope difference of the voltage estimation equation is less than a preset first reference value. In this case, the first reference value may be determined based on a multiple of a standard deviation a for a slope difference of a voltage estimation equation for a plurality of battery cells included in a battery rack. For example, the first reference value may be 6σ.

Herein, idle long-time relaxation of the battery cell may be an abnormal type where the battery cell takes a longer time to reach a stable state than other battery cells after the idle state. When such idle long-time relaxation occurs, it may mean that an operation between an anode and a cathode in the battery cell is not smooth, causing a problem in battery performance.

In addition, the diagnosing unit 230 may diagnose the battery cell as post-charging or post-discharging idle voltage abnormality when the slope difference of the voltage estimation equation is greater than or equal to the first reference value. The post-charging or post-discharging idle voltage abnormality of the battery cell indicates an abnormality type where the voltage is unstable rather than gently increasing or decreasing in a post-charging or post-discharging idle period of the battery cell. For example, in the case of post-charging or post-discharging idle voltage abnormality of the battery cell, the slope of the voltage of the battery cell may change out of a certain sigma level.

More specifically, the diagnosing unit 230 may diagnose the battery cell as post-charging idle voltage abnormality when a start voltage of the idle period of the battery cell is greater than a preset second reference value, and diagnose the battery cell as post-discharging idle voltage abnormality when the start voltage of the idle period of the battery cell is less than or equal to the second reference value, in the case of the slope difference of the voltage estimation equation being greater than or equal to the first reference value. For example, the second reference value may be determined as a voltage corresponding to a SOC of the battery cell being 50%.

The diagnosing unit 230 may diagnose the battery cell as post-charging idle voltage abnormality when current of the battery cell flows in a first direction and diagnose the battery cell as post-discharging idle voltage abnormality when the current of the battery cell flows in a second direction that is opposite to the first direction, in the case of the slope difference of the voltage estimation equation is greater than or equal to the first reference value. In this case, the direction of the current may be indicated by (+) or (−).

The notifying unit 240 may generate an alarming notification when it is determined by the diagnosing unit 230 that abnormality occurs in the battery cell. In this case, the notifying unit 240 may generate a different alarming notification for each of three battery abnormality types, i.e., idle long-time relaxation, post-charging idle voltage abnormality, and post-discharging idle voltage abnormality, to allow a user to identify each abnormality type. For example, the notifying unit 240 may include a lamp, a speaker, etc.

Meanwhile, FIG. 2, the battery abnormality diagnosis apparatus 200 according to an embodiment of the present invention may include a storing unit. In this case, the storing unit may store various data, such as voltage and current data obtained by the voltage obtaining unit 210, a voltage estimation equation and a graph calculated by the analyzing unit 220, a standard deviation for a slope difference of a voltage estimation equation, etc. The battery abnormality diagnosis apparatus 200 according to an embodiment of the present invention may operate by transmitting and receiving the above-described data in communication with an external server through a communicating unit of including the storing unit.

Moreover, although it is illustrated in FIG. 2 that the battery abnormality diagnosis apparatus 200 according to an embodiment of the present invention classifies the battery cell into the types of idle long-time relaxation, post-charging idle voltage abnormality, and post-discharging idle voltage abnormality, the present invention is not limited thereto, and classification into various abnormality types may be possible through a statistical method.

A method for classifying the battery cell as an abnormality type may also make a diagnosis in other various statistical methods without being limited to the above-described method. For example, the slope of the voltage estimation equation may be used in place of the slope difference of the voltage estimation equation, and other data such as differential data, etc., may be used.

As such, with the battery abnormality diagnosis apparatus 200 according to an embodiment of the present invention, by diagnosing the unstable behavior of the voltage in the idle period of the battery, the abnormality type in the idle period of the battery may be classified.

Figure 3A:
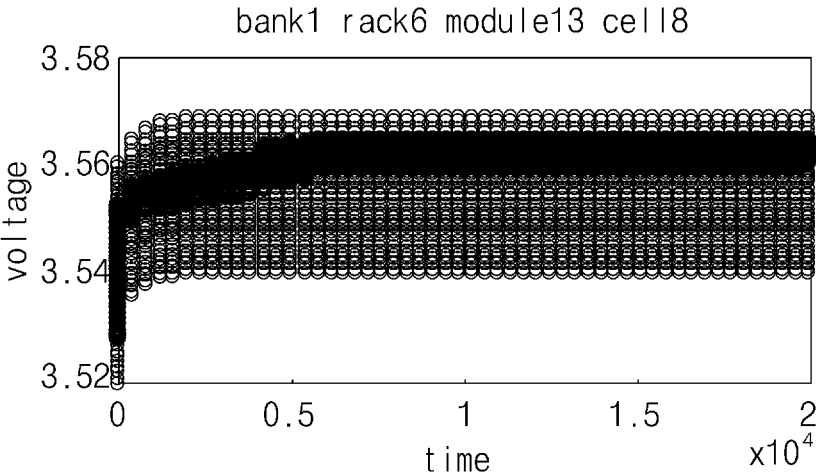
FIGS. 3A through 3C show that idle long-time relaxation is classified by a battery abnormality diagnosis apparatus according to an embodiment of the present invention.
Figure 3B:
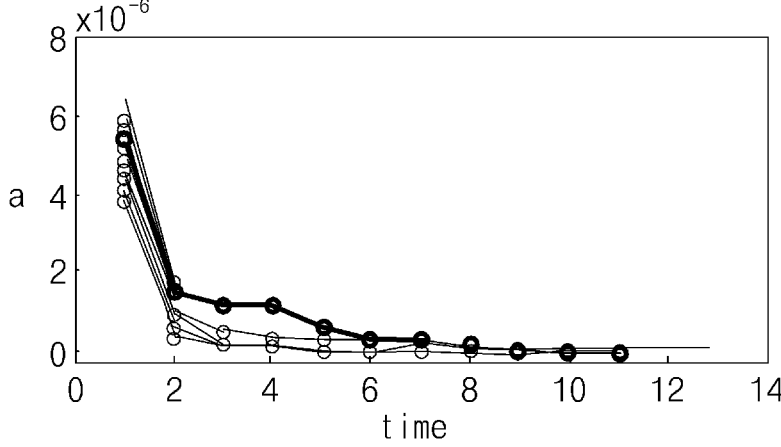
Figure 3C:
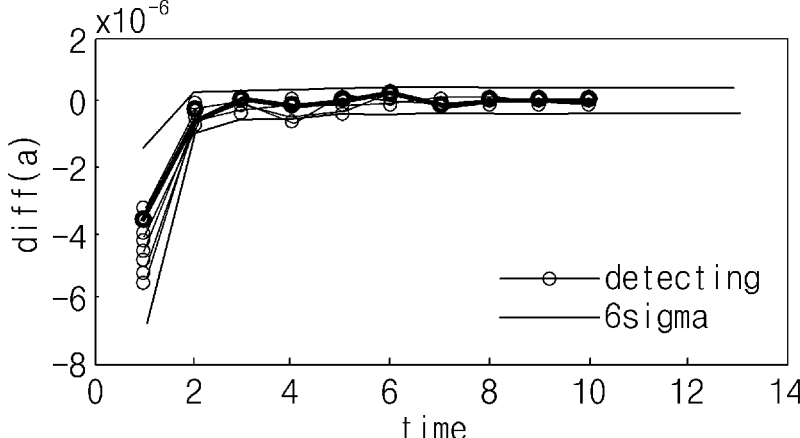

FIGS. 3A through 3C show that idle long-time relaxation is classified by a battery abnormality diagnosis apparatus according to an embodiment of the present invention.

Referring to FIGS. 3A through 3C, an example of bank 1/rack 6/module 13/cell 8 of an ESS battery is shown. More specifically, FIG. 3A shows a voltage estimation equation for a voltage of a battery cell as a graph, FIG. 3B shows a slope of the graph of FIG. 3A, and FIG. 3C shows a slope difference for the slope of FIG. 3B. In each graph of FIG. 3, an x axis indicates time m, a y axis of FIG. 3A indicates voltage V, a y axis of FIG. 3B indicates a slope a of the voltage estimation equation, and a y axis of FIG. 3C indicates a slope difference diff(a).

As shown in FIG. 3C, the battery abnormality diagnosis apparatus 200 according to an embodiment of the present invention may diagnose the battery cell as idle long-time relaxation abnormality when a standard deviation for the slope difference of the voltage estimation equation calculated as shown in FIG. 3A is less than the first reference value (6σ in FIG. 3). That is, referring to FIG. 3C, a part included in a graph region of 6σ (i.e., a bolded graph part) may indicate idle long-time relaxation abnormality of the battery cell.

Figure 4A:
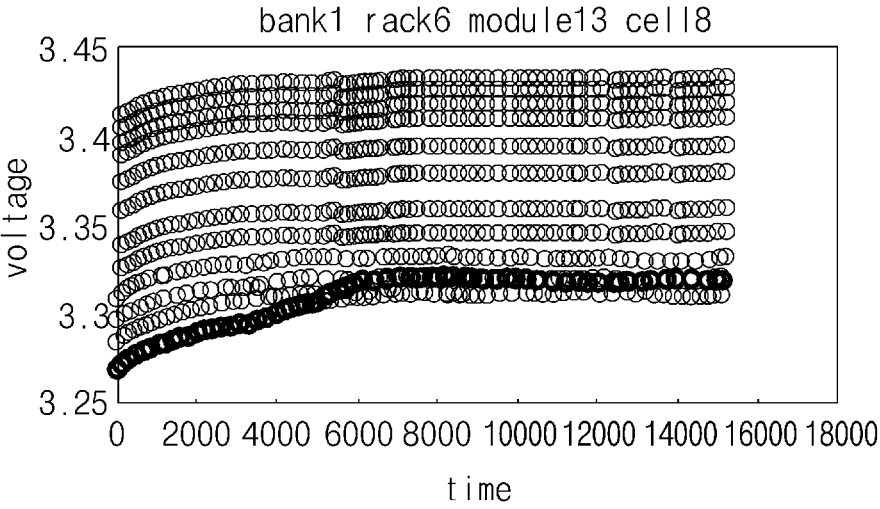
FIGS. 4A through 4C show that post-charging idle voltage abnormality is classified by a battery abnormality diagnosis apparatus according to an embodiment of the present invention.
Figure 4B:
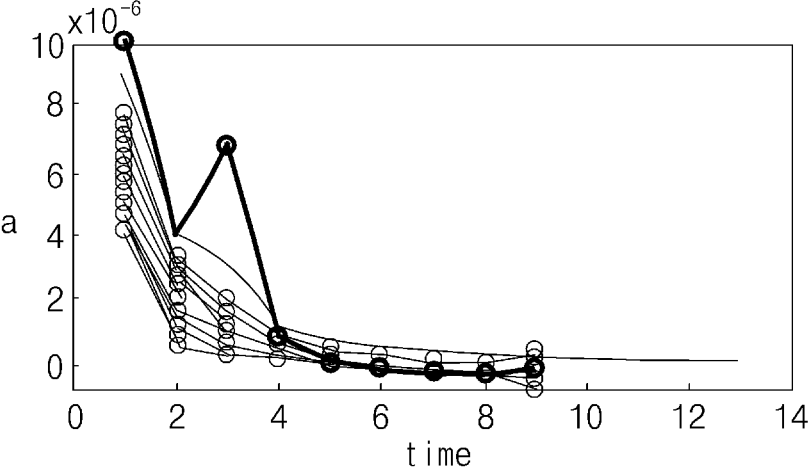
Figure 4C:
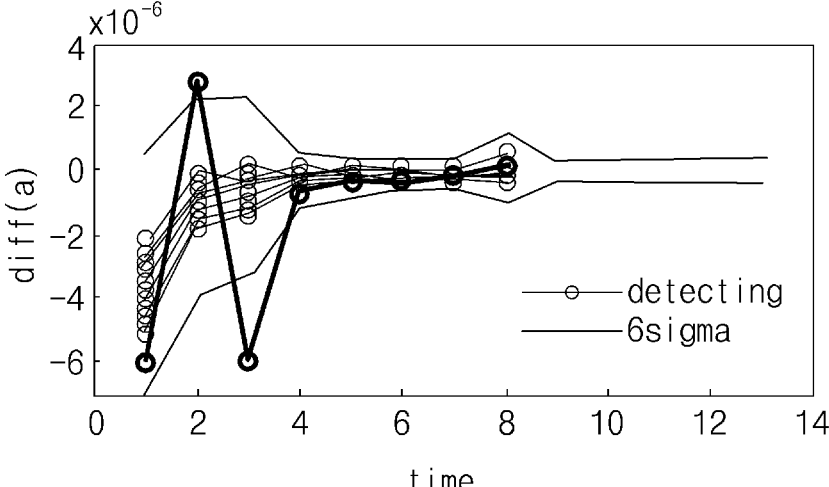

FIGS. 4A through 4C show that post-charging idle voltage abnormality is classified by a battery abnormality diagnosis apparatus according to an embodiment of the present invention.

Referring to FIGS. 4A through 4C, an example of bank 1/rack 6/module 13/cell 8 of an ESS battery is shown. Like FIG. 3, FIG. 4A shows a voltage estimation equation for a voltage of a battery cell as a graph, FIG. 4B shows a slope of the graph of FIG. 4A, and FIG. 4C shows a slope difference for the slope of FIG. 4B. In each graph of FIG. 4, an x axis indicates time m, a y axis of FIG. 4A indicates voltage V, a y axis of FIG. 4B indicates a slope a of a voltage estimation equation, and a y axis of FIG. 4C indicates a slope difference diff(a).

As shown in FIG. 4C, the battery abnormality diagnosis apparatus 200 according to an embodiment of the present invention may diagnose the battery cell as post-charging or post-discharging idle voltage abnormality when the slope difference of the voltage estimation equation calculated as shown in FIG. 4A is greater than or equal to the first reference value (6σ in FIG. 4). That is, referring to FIG. 4C, a part out of the graph region of 6σ (i.e., a bolded graph part) may indicate post-charging or post-discharging idle voltage abnormality of the battery cell.

More specifically, the battery cell may be diagnosed as post-charging idle voltage abnormality when the start voltage of the idle period of the battery cell is greater than a second reference value (e.g., 3.8 V) and as post-discharging idle voltage abnormality when the start voltage of the idle period of the battery cell is less than or equal to the second reference value, in the case of the slope difference of the voltage estimation equation of FIG. 4C being greater than or equal to the first reference value.

Meanwhile, in the case of the slope difference of the voltage estimation equation of FIG. 4C being greater than or equal to the first reference value, the battery cell may be diagnosed as post-charging idle voltage abnormality when the current of the battery cell flows in the first direction (e.g., a (+) direction) and as post-discharging idle voltage abnormality when the current of the battery cell flows in the second direction (e.g., a (−) direction).

Figure 5:
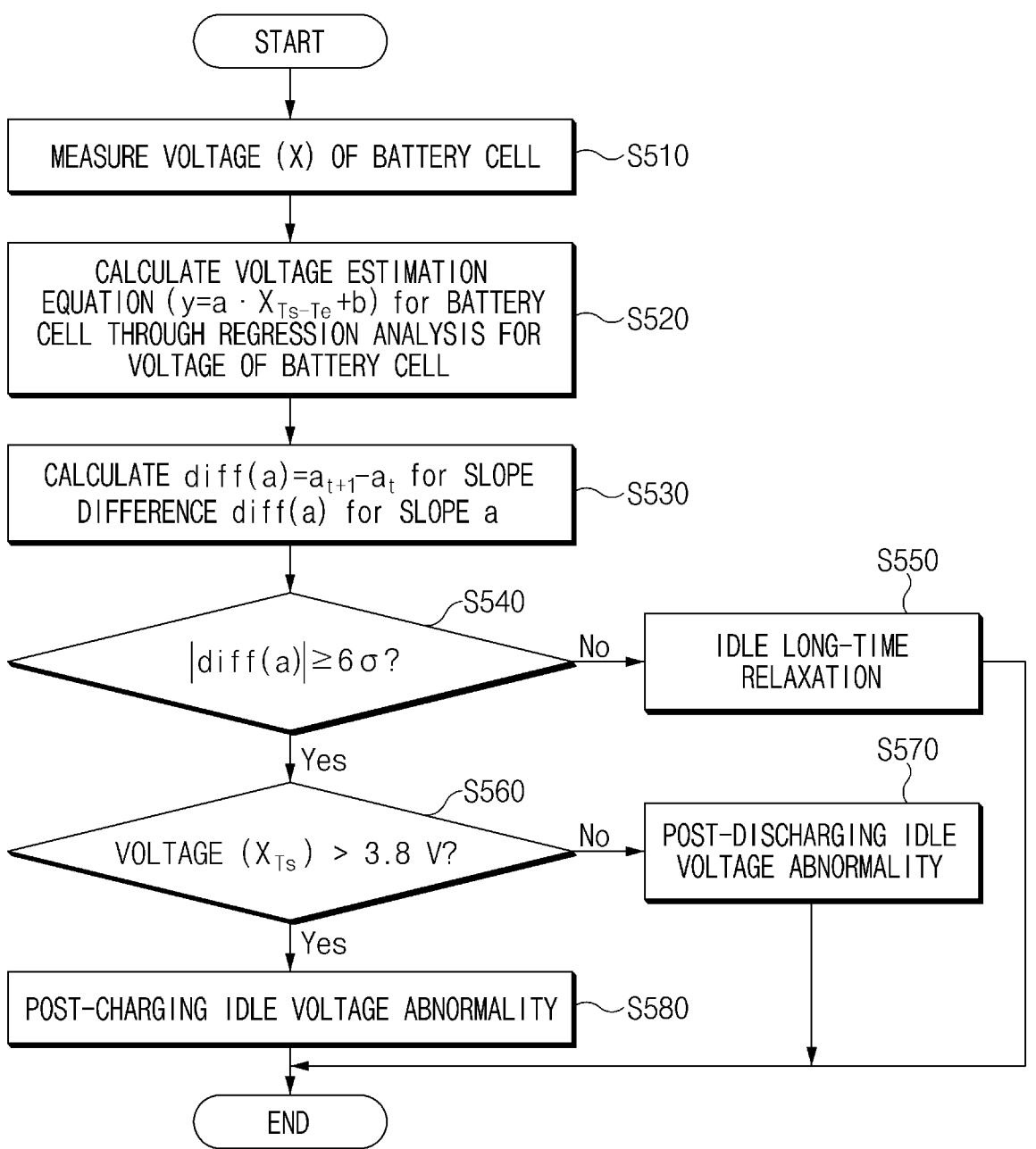
FIG. 5 is a flowchart showing a battery abnormality diagnosis method according to an embodiment of the present invention.

FIG. 5 is a flowchart showing a battery abnormality diagnosis method according to an embodiment of the present invention.

Referring to FIG. 5, a battery abnormality diagnosis method according to an embodiment of the present invention measures a voltage X of a battery cell in operation S510. In this case, in operation S510, the voltage of the battery cell may be measured at specific time intervals. In addition, current flowing in the battery cell may also be measured.

The voltage of the battery cell may be analyzed to calculate estimation information related to the voltage in an idle period (Ts−Te) of the battery cell, in operation S520. For example, the estimation information may include a voltage estimation equation related to the voltage of the battery cell. The voltage estimation equation for the voltage of the battery cell may be calculated with respect to a set window size (e.g., 30 minutes). For example, the voltage estimation equation of the battery cell may be Equation (1) described above.

In operation S530, the slope difference diff(a) for the slope a may be calculated. In this case, the slope difference for the slope a may be expressed as $a_{t+1} - a_t$. A time interval for the slope difference may be a sampling time (e.g., 1 second).

Next, it is determined whether the slope difference (e.g., an absolute value) of the voltage estimation equation is greater than or equal to the preset first reference value (66 in FIG. 5) in operation S540. When the slope difference of the voltage estimation equation is less than the first reference value (No), the battery cell may be determined as idle long-time relaxation abnormality in operation S550.

Meanwhile, when the slope difference of the voltage estimation equation is greater than or equal to the first reference value (Yes), the process goes to operation S560. In operation S560, it is determined whether a start voltage $X_{Ts}$ of the idle period of the battery cell is greater than the preset second reference value (3.8 V in FIG. 5).

When the start voltage $X_{Ts}$ of the idle period of the battery cell is less than or equal to the second reference value (No), the battery cell may be determined as post-discharging idle voltage abnormality in operation S570. Meanwhile, when the start voltage $X_{Ts}$ of the idle period of the battery cell is greater than the second reference value (Yes), the battery cell may be determined as post-charging idle voltage abnormality in operation S580.

Meanwhile, instead of the method of operations S560 through S580, the battery cell may be diagnosed as post-charging idle voltage abnormality when the current of the battery cell flows in the first direction (e.g., the (+) direction) and as post-discharging idle voltage abnormality when the current of the battery cell flows in the second direction (e.g., the (−) direction) that is opposite to the first direction.

As such, with the battery abnormality diagnosis method according to an embodiment of the present invention, by analyzing the unstable behavior of the voltage in the idle period of the battery, the abnormality type in the idle period of the battery may be classified.

Figure 6:
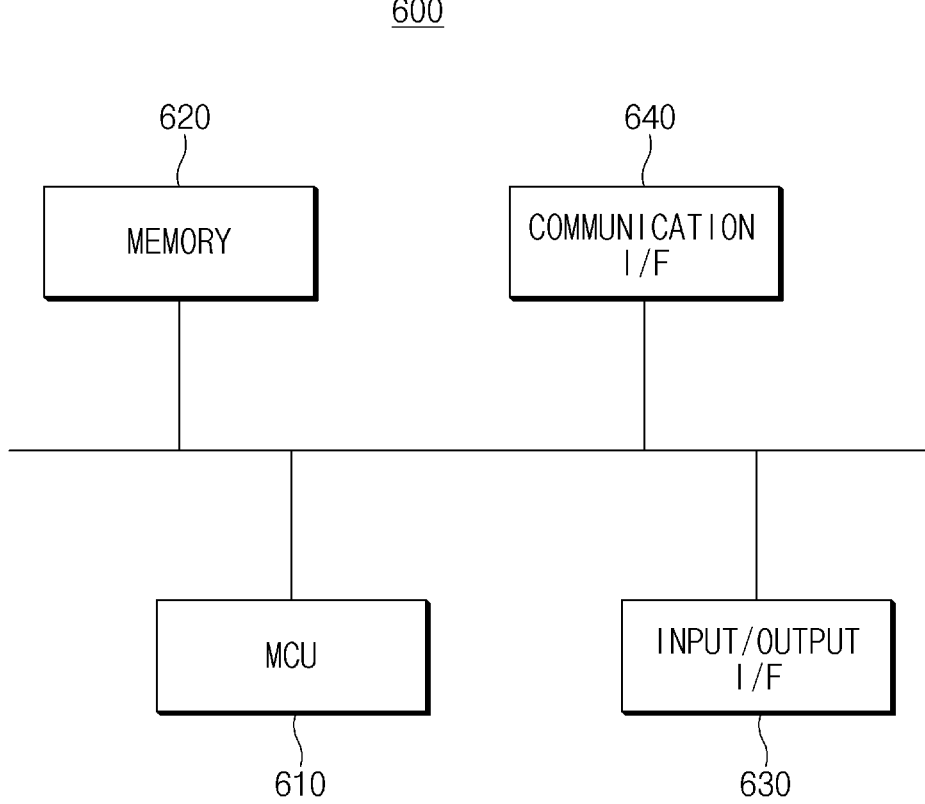
FIG. 6 is a block diagram showing a hardware structure of a battery abnormality diagnosis apparatus according to an embodiment of the present invention.

FIG. 6 is a block diagram showing a hardware structure of a battery abnormality diagnosis apparatus according to an embodiment of the present invention.

Referring to FIG. 6, a battery abnormality diagnosis apparatus 600 according to an embodiment of the present invention may include a microcontroller unit (MCU) 610, a memory 620, an input/output interface (I/F) 630, and a communication I/F 640.

The MCU 610 may be a processor that executes various programs (e.g., a regression analysis program, a battery abnormality type classification program, etc.) stored in the memory 620, processes various data for regression analysis, abnormality type classification, etc., of the battery cell through these programs, and executes the above-described functions of FIG. 2.

The memory 620 may store various programs regarding regression analysis, abnormality type classification, etc., of the battery cell. Moreover, the memory 620 may store various data, such as measured voltage and current data of the battery cell, a graph corresponding to the voltage estimation equation, slope data, etc.

The memory 620 may be provided in plural, depending on a need. The memory 620 may be a volatile or nonvolatile memory. For the memory 620 as the volatile memory, random access memory (RAM), dynamic RAM (DRAM), static RAM (SRAM), etc., may be used. For the memory 620 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 620 are merely examples and are not limited thereto.

The input/output I/F 630 may provide an interface for transmitting and receiving data by connecting an input device such as a keyboard, a mouse, a touch panel, etc., and an output device such as a display, etc., with the MCU 610.

The communication I/F 640, which is a component capable of transmitting and receiving various data to and from a server, may be various types of devices capable of supporting wired or wireless communication. For example, a program for voltage estimation and abnormality type diagnosis of the battery cell or various data may be transmitted and received to and from a separately provided external server through the communication I/F 640.

As such, a computer program according to an embodiment of the present invention may be recorded in the memory 620 and processed by the MCU 610, thus being implemented as a module that performs function blocks shown in FIG. 2.

Even though all components constituting an embodiment of the present invention have been described above as being combined into one or operating in combination, the present invention is not necessarily limited to the embodiment. That is, within the object scope of the present invention, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present invention.

The above description is merely illustrative of the technical idea of the present invention, and various modifications and variations will be possible without departing from the essential characteristics of the present invention by those of ordinary skill in the art to which the present invention pertains Therefore, the embodiments disclosed in the present invention are intended for description rather than limitation of the technical spirit of the present invention, and the scope of the technical spirit of the present invention is not limited by these embodiments. The protection scope of the present invention should be interpreted by the following claims, and all technical spirits within the same range should be understood to be included in the range of the present invention.

The invention claimed is:

1. A battery abnormality diagnosis apparatus comprising:
a voltage obtainer configured to obtain a voltage of a battery cell;
an analyzer configured to calculate estimation information for estimating the voltage of a battery by analyzing the voltage of the battery cell; and
a diagnoser configured to diagnose an abnormality of the battery cell by analyzing the estimation information, the diagnoser being configured to diagnose the abnormality of the battery cell by calculating a slope of a voltage estimation equation and a slope difference of the voltage estimation equation during a current idle period, the voltage estimation equation being calculated based on regression analysis,
wherein, based on the diagnosed abnormality by the diagnoser, a battery management system is configured to control an on and/or off of a switch connected to the battery cell.

2. The battery abnormality diagnosis apparatus of claim 1, wherein the estimation information comprises the voltage estimation equation related to the voltage of the battery cell, and
wherein the diagnoser unit is configured to diagnose the abnormality of the battery cell based on the slope difference with respect to time in the voltage estimation equation.

3. The battery abnormality diagnosis apparatus of claim 2, wherein the diagnoser is configured to diagnose the battery cell as idle long-time relaxation abnormality when the slope difference is less than a first reference value, and diagnose the battery cell as post-charging or post-discharging idle voltage abnormality when the slope difference is greater than or equal to the first reference value.

4. The battery abnormality diagnosis apparatus of claim 3, wherein the first reference value is determined based on a standard deviation for the slope difference of the voltage estimation equation for a plurality of battery cells included in a battery rack.

5. The battery abnormality diagnosis apparatus of claim 3, wherein the diagnoser is configured to diagnose the battery cell as the post-charging idle voltage abnormality when a start voltage of an idle period of the battery cell is greater than a second reference value and diagnose the battery cell as the post-discharging idle voltage abnormality when the start voltage of the idle period of the battery cell is less than or equal to the second reference value, in case of the slope difference being greater than or equal to the first reference value.

6. The battery abnormality diagnosis apparatus of claim 5, wherein the second reference value is determined as a voltage corresponding to a State of Charge (SOC) of the battery cell being 50%.

7. The battery abnormality diagnosis apparatus of claim 3, wherein the diagnoser is configured to diagnose the battery cell as the post-charging idle voltage abnormality when current of the battery cell flows in a first direction and diagnose the battery cell as the post-discharging idle voltage abnormality when the current of the battery cell flows in a second direction that is opposite to the first direction, in case of the slope difference being greater than or equal to the first reference value.

8. The battery abnormality diagnosis apparatus of claim 2, wherein the analyzer is configured to calculate the voltage estimation equation in an idle period after charging or discharging of the battery cell.

9. The battery abnormality diagnosis apparatus of claim 1, further comprising a notifying unit configured to generate an alarming notification when the diagnoser determines that the abnormality occurs in the battery cell.

10. The battery abnormality diagnosis apparatus of claim 1, wherein the diagnoser is configured to diagnose the battery cell as an idle long-time relaxation abnormality when a standard deviation for the slope difference of the voltage estimation equation is less than a first reference value.

11. The battery abnormality diagnosis apparatus of claim 10, wherein the first reference value is set as a multiple of the standard deviation of the slope difference of the voltage estimation equation greater than one.

12. A battery abnormality diagnosis method comprising:
obtaining a voltage of a battery cell;
calculating estimation information for estimating the voltage of a battery by analyzing the voltage of the battery cell;
diagnosing an abnormality of the battery cell by analyzing the estimation information, the diagnosing being based on a slope of a voltage estimation equation and a slope difference of the voltage estimation equation during a current idle period, the voltage estimation equation being calculated based on regression analysis; and
controlling an on and/or off of a switch connected to the battery cell based on the diagnosing the abnormality of the battery cell.

13. The battery abnormality diagnosis method of claim 12, wherein the estimation information comprises the voltage estimation equation related to the voltage of the battery cell, and
wherein the diagnosing of the abnormality of the battery cell comprises diagnosing the abnormality of the battery cell based on the slope difference with respect to time in the voltage estimation equation.

14. The battery abnormality diagnosis method of claim 13, wherein the diagnosing of the abnormality of the battery cell comprises:
diagnosing the battery cell as idle long-time relaxation abnormality when the slope difference is less than a first reference value; and
diagnosing the battery cell as post-charging or post-discharging idle voltage abnormality when the slope difference is greater than or equal to the first reference value.

15. The battery abnormality diagnosis method of claim 14, wherein the diagnosing of the abnormality of the battery cell comprises diagnosing the battery cell as the post-charging idle voltage abnormality when a start voltage of an idle period of the battery cell is greater than a second reference value and diagnosing the battery cell as the post-discharging idle voltage abnormality when the start voltage of the idle period of the battery cell is less than or equal to the second reference value, in case of the slope difference being greater than or equal to the first reference value.

16. The battery abnormality diagnosis method of claim 14, wherein the diagnosing of the abnormality of the battery cell comprises diagnosing the battery cell as the post-charging idle voltage abnormality when current of the battery cell flows in a first direction and diagnosing the battery cell as the post-discharging idle voltage abnormality when the current of the battery cell flows in a second direction that is opposite to the first direction, in case of the slope difference being greater than or equal to the first reference value.

* * * * *